(12) United States Patent
Ekbote et al.

(10) Patent No.: US 8,114,729 B2
(45) Date of Patent: *Feb. 14, 2012

(54) DIFFERENTIAL POLY DOPING AND CIRCUITS THEREFROM

(75) Inventors: Shashank Ekbote, Allen, TX (US); Kamel Benaissa, Dallas, TX (US); Greg C. Baldwin, Plano, TX (US); Borna Obradovic, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 906 days.

This patent is subject to a terminal disclaimer.

(21) Appl. No.: 11/870,255

(22) Filed: Oct. 10, 2007

(65) Prior Publication Data

US 2009/0096031 A1    Apr. 16, 2009

(51) Int. Cl.
H01L 21/8238    (2006.01)
(52) U.S. Cl. ........ 438/229; 438/230; 438/184; 438/382; 438/265; 257/903
(58) Field of Classification Search .................. 438/210, 438/382, 229, 230, 184, 265; 257/903
See application file for complete search history.

(56) References Cited

U.S. PATENT DOCUMENTS

| 6,198,173 | B1 * | 3/2001 | Huang | 257/536 |
| 7,718,482 | B2 * | 5/2010 | Ekbote et al. | 438/200 |
| 2002/0086489 | A1 * | 7/2002 | Chatterjee | 438/338 |

* cited by examiner

*Primary Examiner* — Samuel Gebremariam
(74) *Attorney, Agent, or Firm* — Warren L. Franz; Wade J. Brady, III; Frederick J. Telecky, Jr.

(57) ABSTRACT

A method of fabricating a CMOS integrated circuit and integrated circuits therefrom includes the steps of providing a substrate having a semiconductor surface, forming a gate dielectric layer on the semiconductor surface and a polysilicon including layer on the gate dielectric. A portion of the polysilicon layer is masked, and pre-gate etch implant of a first dopant type into an unmasked portion of the polysilicon layer is performed, wherein masked portions of the polysilicon layer are protected from the first dopant. The polysilicon layer is patterned to form a plurality of polysilicon gates and a plurality of polysilicon lines, wherein the masked portion includes at least one of the polysilicon lines which couple a polysilicon gate of a PMOS device to a polysilicon gate of an NMOS device. Fabrication of the integrated circuit is then completed, wherein the integrated circuit includes at least one first region formed in the masked portion lacking the first dopant in the polysilicon gates from the pre-gate etch implant and at least one second region formed in the unmasked portion having the first dopant in the polysilicon gates from the pre-gate etch implant.

10 Claims, 3 Drawing Sheets

US 8,114,729 B2

DIFFERENTIAL POLY DOPING AND CIRCUITS THEREFROM

FIELD OF INVENTION

The present invention relates generally to semiconductor processing, and more particularly to CMOS processing flows and devices therefrom which utilize doping differentials to improve circuit performance.

BACKGROUND

An n+ polysilicon (also called "poly") pre-gate doping mask has traditionally been used to achieve dopant levels above levels provided by the n+ source/drain implant in n-doped polysilicon to improve NMOS transistor performance in CMOS integrated circuits. In such a flow, following polysilicon deposition, an n-poly pre-gate etch doping mask is used for protecting/covering the poly regions corresponding to the PMOS gate area, and n-type dopant (e.g. P or As) is implanted into the polysilicon layer corresponding to the NMOS gate area. An optional dopant anneal may follow the n+ poly pre-gate etch implant to activate the dopant. A gate etch step then follows to define the n-type and p-type doped polysilicon gates for the respective NMOS and PMOS transistors.

As known in the art, TOXINV (which may also be called inversion TOX), refers to the loss of inversion charge and therefore transconductance due to inversion-layer quantization and polysilicon-gate depletion effects. Quantum mechanics considerations dictate that the density of inversion electrons peaks at approximately 1 nm below the polysilicon surface, which effectively reduces the gate capacitance and therefore the inversion charge in the case of an oxide dielectric to those of an equivalent oxide dielectric about 0.4 nm thicker than the physical gate dielectric (e.g. oxide). Similarly, depletion effects occur in polysilicon in the form of a thin space-charge layer near the dielectric interface which acts to reduce the gate capacitance and inversion-charge density for a given gate drive condition. The percentage of gate-capacitance attenuation is known to become more significant as the dielectric thickness is reduced. For example, for a polysilicon doping level of $10^{20}$ atoms/cm$^3$, a 2-nm oxide dielectric loses about 20% of the inversion charge at 1.5 Volt gate voltage because of the combined effects of polysilicon gate depletion and inversion-layer quantization. Using n-type dopant in n-type polysilicon for NMOS transistors above levels provided by source/drain implantation is known to provide a reduced TOXINV, which in turn improves NMOS performance.

CMOS logic gates are used in a wide variety of CMOS circuits and are all generally based on the static CMOS inverter. FIG. 1 shows a schematic diagram of a conventional static CMOS inverter circuit 10. Both transistors in the inverter circuit 10 are generally enhancement-mode MOSFETs; NMOS 12 with its source grounded, and PMOS 11 with its source connected to Vdd. Their respective gates are connected together to form the input, shown as A, generally coupled together using a polysilicon line 15, and their drains are connected together to form the output, shown as Q. During their respective source/drain implants, the gate electrode of the PMOS 11 is doped p+, while the gate electrode of the NMOS 12 is doped n+. A silicide or other shunting layer is generally used to short the n+/p+ diode formed by the polysilicon line 15 coupling the gates of PMOS 11 and NMOS 12.

As known in the art, the inverter is used in other logic gates, such as for NOR and NAND structures, by combining inverters in a partially series, partially parallel structure, and in other circuits such as certain latches. Regarding latches, for example, a master-slave D flip-flop includes a CMOS inverter to invert the enable input applied to the master for application to the slave.

Moreover, certain high density circuits having a large number of transistors, from complex microprocessor integrated circuits to signal processing and communication circuits generally, include CMOS inverters. For example, the arithmetic logic unit (ALU) for a microprocessor generally includes CMOS logic gates, including a plurality of CMOS inverters.

Another example of an integrated circuit that includes CMOS inverters is a static random access memory (SRAM), which generally uses a pair of cross-coupled inverters in the bit cells. For example, for integrated circuits that include conventional 5T or 6T SRAM cells, the PMOS load (pull-up) and NMOS driver (pull-down) transistors share a common polysilicon gate.

Yet another example of an integrated circuit that uses CMOS inverters is a dynamic random access memory (DRAM). The sense amplifier in a DRAM is typically essentially a pair of cross-connected inverters between the bit lines. That is, the first inverter is connected from the + bit line to the − bit line, and the second inverter is connected from the − bit line to the + bit line.

With the pre-gate doping provided by an n+ poly pre-gate etch mask on circuits which include CMOS inverters such as most SRAMs, the PMOS load transistor can experience significant cross-diffusion from grain boundary dopant diffusion by the n-type (e.g. phosphorous) dopant implanted into the polysilicon for the NMOS. As a result, the SRAM PMOS load transistors can suffer an increase in TOXINV, resulting in performance degradation including $ID_{SAT}$ (drain saturation current). Depending on variability in TOXINV, transistor performance and parameters such as $VT_{LIN}$ (linear threshold voltage), $VT_{SAT}$ (saturation threshold voltage) can vary locally, including within cells. Variation of SRAM load transistor performance in a cell can also increase substantially, leading to degraded cell stability and possible impairment in function.

For SRAMs, scaling is known to degrade stability. Scaling can also exacerbate the p+ polysilicon counterdoping problem described above. For example, when design rules shrink, the pre-etch n-poly mask edge to n-well boundary spacing generally shrinks.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A method of fabricating a CMOS integrated circuit includes the steps of providing a substrate having a semiconductor surface, forming a gate dielectric layer on the semiconductor surface and a polysilicon including layer on the gate dielectric. A portion of the polysilicon layer is masked, and pre-gate etch implant of a first dopant type into an unmasked portion of the polysilicon layer is performed, wherein masked portions of the polysilicon layer are protected from the first dopant implant. The polysilicon layer is patterned to form a plurality of polysilicon gates and a plurality of polysilicon lines, wherein the masked portion includes at least one of the polysilicon lines which couples a polysilicon gate of a PMOS device to a polysilicon gate of an NMOS device. Fabrication of the integrated circuit is completed, wherein the integrated circuit includes at least one first region formed in the masked portion lacking the first dopant in the polysilicon gates from the pre-gate etch implant and at least one second region formed in the unmasked portion having the first dopant in the polysilicon gates from the pre-gate etch implant. The first dopant type can comprise an n-type dopant, such as phosphorous or arsenic.

The method can further comprise the step of rapid thermal annealing in a temperature range from 1000 to 1070° C. for less than 10 seconds to activate the first dopant from the pre-gate etch implant step before the patterning step.

In one embodiment, the polysilicon gates in the unmasked portion of the circuit have at least a 20% higher dose of the first dopant than the polysilicon gates in the masked portion, such as at least a 30% higher dose. The patterning step can define a plurality of polysilicon lines, wherein the CMOS integrated circuit can comprises an SRAM having a plurality of memory cells formed in the masked portion, the memory cells comprising cross-coupled inverters having PMOS loads and NMOS drivers coupled by one of the polysilicon lines.

The completing step can include the step of n+ source/drain implanting the NMOS device using a phosphorous dose between $2 \times 10^{15}$ and $5 \times 10^{15}$ atoms/cm$^2$ at an energy between 2 and 8 KeV, wherein the pre-gate etch implanting can comprises a phosphorous dose of $5 \times 10^{14}$ and $5 \times 10^{15}$ atoms/cm$^2$ at an energy between 2 and 8 KeV or an arsenic dose between $5 \times 10^{14}$ and $5 \times 10^{15}$ atoms/cm$^2$ at an energy between 20 and 40 KeV.

A method of fabricating a CMOS integrated circuit comprises the steps of providing a substrate having a semiconductor surface, forming a gate dielectric layer on the semiconductor surface and a polysilicon comprising layer on the gate dielectric. A portion of the polysilicon layer is masked. A pre-gate etch phosphorous implant is performed into an unmasked portion of the polysilicon layer, wherein masked portions of said polysilicon layer are protected from the phosphorous implant. The polysilicon layer is patterned to form a plurality of polysilicon gates and polysilicon lines. Fabrication of the integrated circuit is completed, wherein the integrated circuit comprises an SRAM having at least one memory region formed in said masked portion lacking said phosphorous in said polysilicon from said pre-gate etch implant and at least one non-memory region formed in said unmasked portion having phosphorous in polysilicon from said pre-gate etch implant.

A CMOS integrated circuit comprises a substrate having a semiconductor surface, a gate dielectric layer on the semiconductor surface and a plurality of polysilicon gates and a plurality of polysilicon lines on the gate dielectric layer. The polysilicon gates and lines in a first region of the circuit have a lower dose of a first dopant type as compared to the polysilicon gates and lines in a second region of said circuit which have at least a 20% higher dose of the first dopant type. The circuit includes a plurality of PMOS devices including respective ones of the plurality of polysilicon gates and a plurality of NMOS devices including respective ones of the plurality of polysilicon gates, wherein at least one of the plurality of PMOS or NMOS devices includes some devices formed in the first region and some devices formed in the second region, and the circuit includes at least one CMOS inverter. The CMOS integrated circuit can comprise a memory formed in the first region, such as an SRAM having a plurality of memory cells comprising cross-coupled inverters having PMOS loads and NMOS drivers coupled by one of the polysilicon lines.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Figure 1:
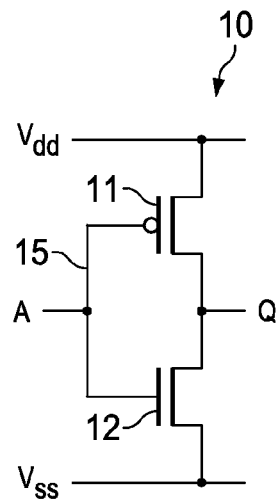
FIG. 1 is a schematic of a conventional static CMOS inverter circuit.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts can occur in different orders and/or concurrently with other acts or events. Furthermore, not all illustrated acts or events are required to implement a methodology in accordance with the present invention.

Embodiments of the invention enable selective use of a pre-gate etch n+ or p+ poly mask for NMOS or PMOS transistor performance improvement in one portion of the circuit, while blocking the pre-gate etch n+ or p+ poly implant to another portion of the circuit. No added pattern levels are generally needed. The invention is broadly applicable to CMOS integrated circuits, particularly those that include polysilicon lines coupling the polysilicon gates of NMOS and PMOS transistors, such as in conventional CMOS inverters and other logic gates.

Figure 2:
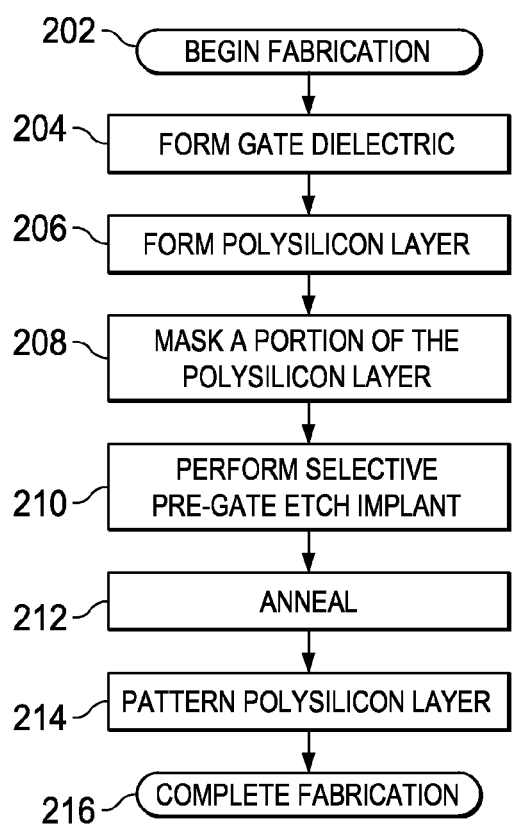
FIG. 2 is a flow diagram illustrating a method of fabricating a CMOS semiconductor device having differential polysilicon doping according to an embodiment of the invention.

FIG. 2 is a flow diagram illustrating a method of fabricating a CMOS semiconductor device having differential polysilicon doping, according to an embodiment of the invention. In step 202, fabrication begins and includes the step of providing a substrate having a semiconductor surface, and generally includes the steps of well formation and isolation processing. Substrates can be semiconductor or dielectric material, or variants such as semiconductor on insulator (SOI). A gate dielectric layer (e.g., silicon dioxide, oxynitride or a high-k dielectric) is formed in step 204, such as grown or deposited, on the semiconductor surface. In step 206, a polysilicon comprising layer is formed on the gate dielectric layer. A portion of the polysilicon layer is masked in step 208. A pre-gate etch implant is performed in step 210 to provide dopant into an unmasked portion of the polysilicon layer, wherein masked portions of the polysilicon layer are protected from the pre-gate etch implant dopant. In the case of an n-type pre-gate etch implant, dopant for the pre-gate etch implant can comprise at least one of phosphorous or arsenic. For example, the pre-gate etch implant can comprise a phosphorous dose of between $5 \times 10^{14}$ and $5 \times 10^{15}$ atoms/cm$^2$ at an energy between 2 and 8 KeV or an arsenic dose of between $5 \times 10^{14}$ and $5 \times 10^{15}$ atoms/cm$^2$ at an energy between 20 and 40 KeV (energy generally a function of poly thickness).

In step 212, an optional anneal, such as in one embodiment a 950° C. rapid thermal anneal (RTA) for a few seconds, is performed to activate the pre-gate etch implanted dopant before the poly patterning step. The polysilicon layer is then patterned in step 214 to form a plurality of polysilicon gates and generally a plurality of polysilicon lines.

Fabrication is then completed in step 216, such as in the exemplary manner described below. Upon completing fabrication of the integrated circuit, the integrated circuit comprises at least one first region formed in the masked portion during the pre-gate etch poly implant (and thus lacks the pre-gate n+ or p+ poly implant dose) and at least one second region formed in the unmasked region during the pre-gate etch poly implant and thus the polysilicon therein includes the pre-gate n+ or p+ poly implant.

Regarding the exemplary manner for completion of fabrication, a thin offset layer (e.g., a silicon dioxide or silicon nitride layer) is formed generally conformally over the patterned polysilicon gate and then etched using a generally anisotropic dry etch to leave a thin offset spacer material on lateral edges of the gate. An extension region implant is then performed to form extension regions. For example, lightly doped, medium doped or heavily doped extension region implants are performed in the NMOS and PMOS regions, respectively. A thermal process such as a rapid thermal anneal can then be employed to activate the extension region dopants, which causes the extension regions to diffuse laterally slightly underneath the offset spacer toward the channels. Sidewall spacers are then formed on the gate structures. The sidewall spacers are substantially thicker than the offset spacers, thereby resulting in the subsequently formed source/drain regions to be offset from lateral edges of the gate. Source/drain regions are then formed in the NMOS and PMOS regions of the device. In one embodiment, the n+ source/drain (S/D) implant can comprise a phosphorous implant, such as using a dose between $2 \times 10^{15}$ and $5 \times 10^{15}$ atoms/cm$^2$ at an energy between 2 and 8 KeV. The respective poly gates are also generally implanted during the respective S/D implants. Subsequently, other features and/or components of the device can be formed. For example, subsequent steps can include silicidation (e.g. CoSi$_2$ or NiSi) of the S/D region and the polysilicon gate. Electrically conductive contacts can be formed through a pre-metal dielectric (PMD) layer and portions of the stress inducing liner to provide electrical connection for the transistor terminals. Generally, contact formation comprises forming openings in the PMD layer through suitable masking and etching processes, followed by deposition of conductive material (e.g., tungsten or other suitable materials), and subsequent planarization (e.g., chemical mechanical polishing, etc.). One or more metallization levels or layers can then be formed to provide electrical interconnection of the various electrical components in the device, wherein each metallization level includes an inter-level or inter-layer (ILD) dielectric formed over a preceding level, with vias and/or trenches formed therein and filled with a conductive material.

Figure 3:
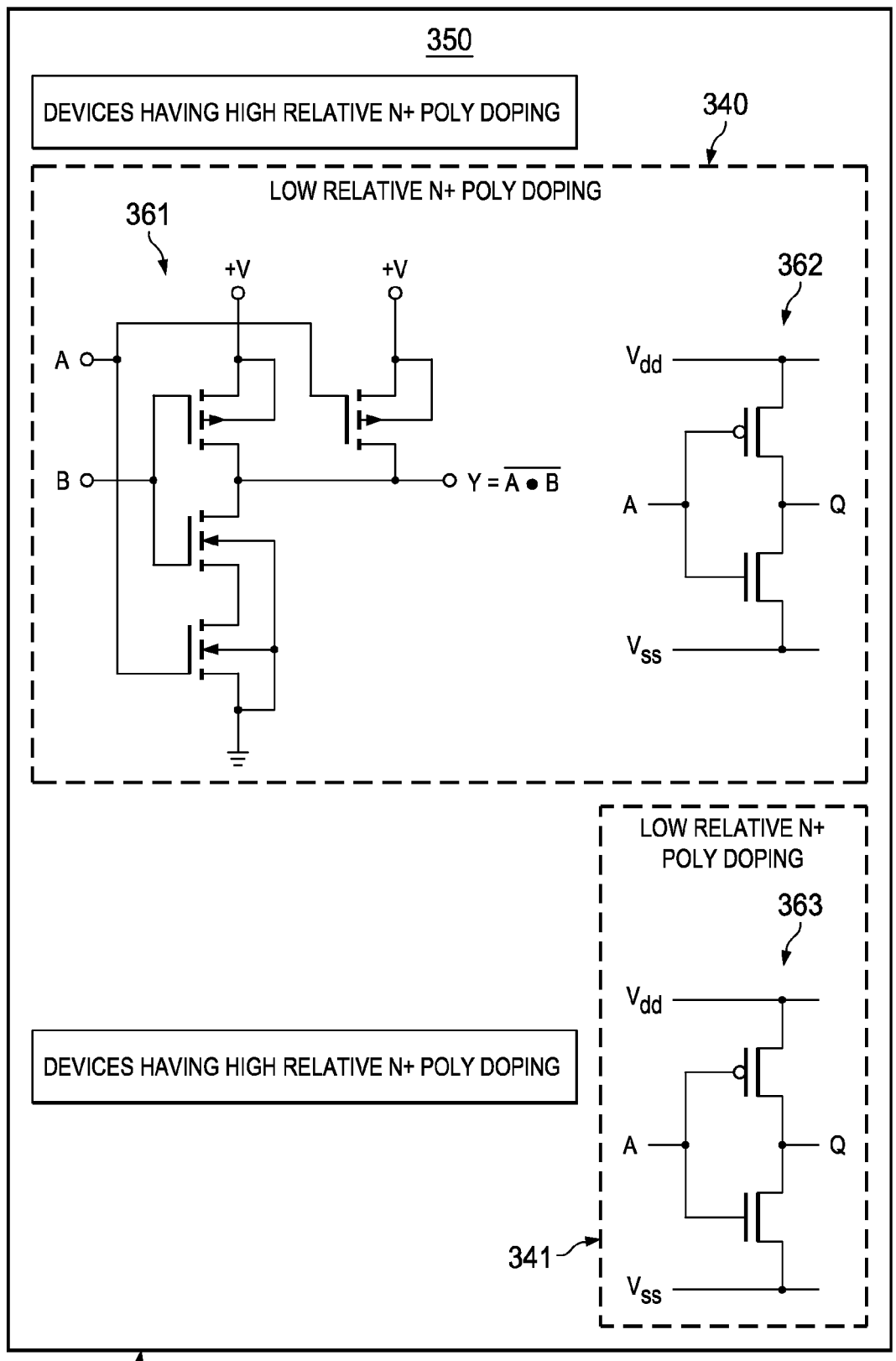
FIG. 3 is a schematic diagram of an integrated circuit showing logic gates in certain regions of the circuit having a lower polysilicon doping level as compared to polysilicon doping in the other portions of the circuit in which devices therein have a higher relative polysilicon doping level, according to an embodiment of the invention.

FIG. 3 is a simplified schematic diagram of an integrated circuit 310 showing several logic gates in certain regions of the circuit 340 and 341 having a lower n+ polysilicon doping level as compared to n+ polysilicon doping level in the remaining regions of the circuit 350 in which various devices therein have a higher relative n+ polysilicon doping level, according to an embodiment of the invention. Integrated circuit 310 can comprise a wide variety of CMOS circuits, including, but not limited to, a microprocessor, a signal processor, a communication circuit, or a memory circuit, such as a DRAM or SRAM. For example, region 340 shown in FIG. 3 includes a two-input NAND gate 361 and an inverter 362, while region 341 includes an inverter 363. Two-input NAND gate 361 and inverter 362 both include PMOS and NMOS gates tied together using a common polysilicon line.

Regions 340, 341 and 350 all receive the same dopant dose in the polysilicon therein during the source/drain implant. However, while polysilicon in region 350 receives the n+ pre-gate etch implant, polysilicon in regions 340 and 341 are masked during the n+ pre-gate etch implant and thus do not receive the n+ pre-gate implant. As a result, the total n+ dose in the n-type polysilicon in region 350 being the combination of the n+ pre-gate etch implant and n+ S/D dose is generally at least 20% higher as compared to the dose in n-type polysilicon in regions 340 and 341 which receive only the n+ S/D dose. In certain embodiments, the difference can be 25%, 30%, 40%, 50%, or more than 50%. Doping level differences can be determined using several methods, including scanning capacitive microscopy.

Figure 4:
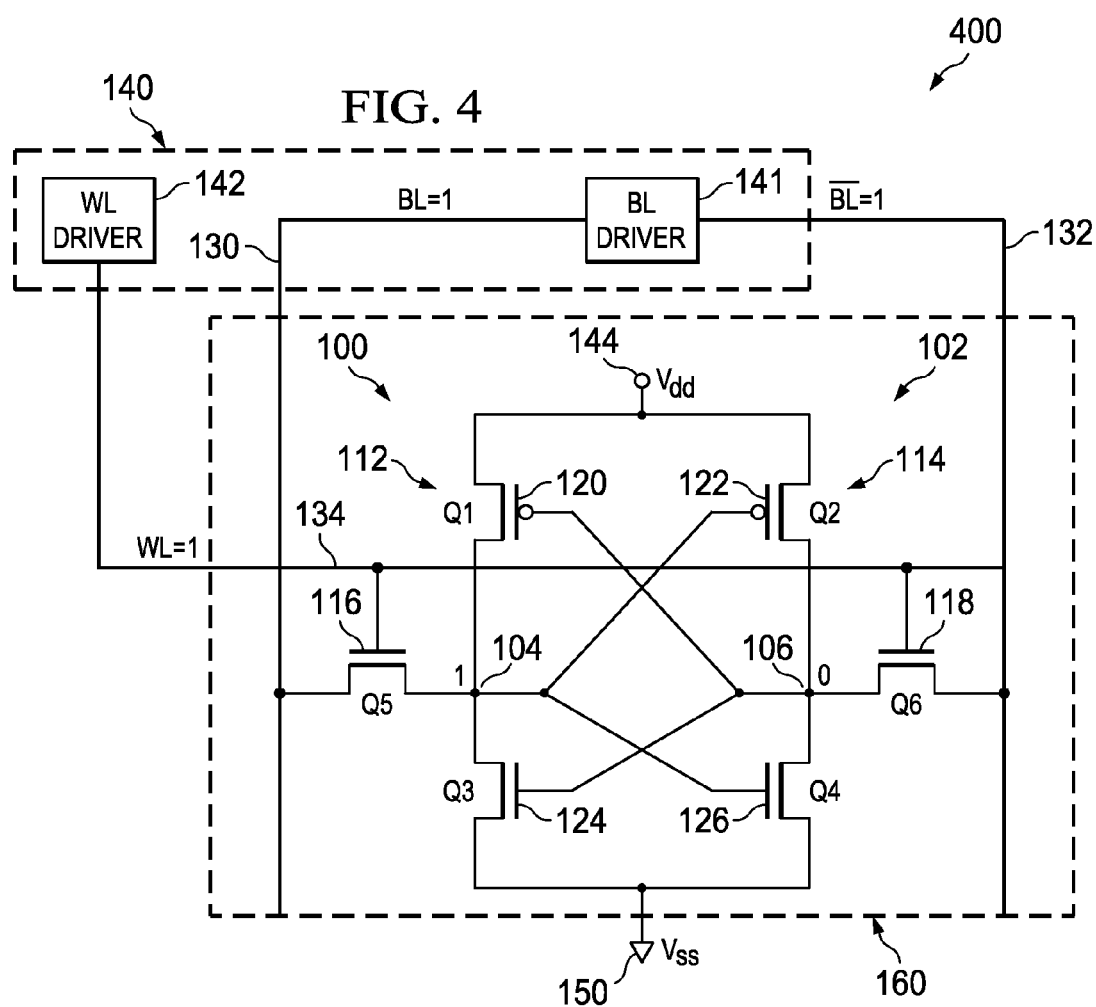
FIG. 4 is a schematic diagram of an integrated circuit comprising a differential 6T static random access memory (SRAM) cell and WL and BL drivers, according to an embodiment of the invention, wherein the 6T cell is formed in a first region of the circuit having a lower polysilicon doping level as compared to the WL and BL drivers and other non-memory circuitry which are formed in a second region of the circuit having a higher relative polysilicon doping level.

In one specific embodiment of the invention, the integrated circuit comprises an SRAM. FIG. 4 is schematic of an integrated circuit 400 including a conventional differential SRAM 6T cell 100 formed in a region of the circuit 160 and non-memory region 140. The n+ dose in n-type polysilicon in non-memory region 140 is at least 20% higher as compared to the dose in n-type polysilicon in memory cell region 160. Non-memory portions of the SRAM 140 generally operate at relatively higher power as compared to the memory cell region 160. The non-memory region typically handles interfacing with external devices (data in and out of the chip), power management, voltage regulation, and the like.

Non-memory region 140 is shown including BL driver 141 and WL driver 142 where the higher n+ dose in n-type polysilicon can be used. Bit cells 100 as illustrated comprise a data storage cell or latch 102, generally including a pair of cross-coupled inverter (for example, inverter 112 and inverter 114) the latch 102 being operable to store a data bit state. FIG. 4 illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bit lines BL 130, BL-bar 132, when enabled by wordline 134.

Respective inverters 112, 114 comprise p-type MOS (PMOS) pull-up or load transistors Q1 120, Q2 122 and an n-type (nMOS) pull-down transistors Q3 124, Q4 126. Pass-gate transistors Q5 116, Q6 118 are n-channel transistors as well, which generally supply higher conductance than p-channel transistors. Passgate transistors 116, 118 are enabled by wordline 134 and accessed by bit lines 130, 132 to set or reset the SRAM latch 100. Inverters 112, 114 of the SRAM memory cell 100 are connected together to a Vdd drain power supply line 144 and a Vss source power supply line 150.

In general, SRAM cells are more stable and have better data retention where the respective PMOS (120, 122) and NMOS (124, 126) transistors are balanced and matched within the two inverters (112, 114). However, as dimensions are reduced to scale down devices, as noted above, in structures such as inverters that use poly coupling PMOS gates to NMOS gates, dopant in n+ poly (particularly in the case of phosphorous) can diffuse to counterdope p+ doping in the p+ poly gates. The counterdoping can vary significantly, even locally, such as within a bit cell mainly due to grain boundary diffusion effects. In the 6T cell, for example, counterdoping can cause imbalance in the PMOS load transistors, leading to degraded stability and may be unstable enough to not be able to retain the desired bit state, during either or both the read or write operations.

Applied to inverter comprising SRAMs, such as 5T or 6T SRAMs, through use of an appropriate mask, the pre-gate n+ poly implant can be blocked for NMOS transistors in the SRAM cells (passgate transistor issue above), and allowed to reach the polysilicon outside the SRAM cell region (e.g., controller or driver and logic region). Modification in the pre-gate n-poly pattern for these embodiments of the invention can be such that whenever the SRAM layer is drawn, the n-poly implant is blocked from that region. Blocking n-poly implants in NMOS transistors whenever they are in the SRAM bit cell allows keeping n-poly implants in non-memory NMOS transistors thereby utilizing its potential of improving NMOS transistor performance through reduction of inversion TOX. Keeping the pre-gate n-poly implant out of the bit cell region eliminates or at least reduces induced cross-diffusion problems for the PMOS (load/pull-up) transistor in SRAM bit cell. Thus, embodiments of the invention provide a yield and performance enhancer, without degrading non-memory (e.g., logic) NMOS transistor performance.

Embodiments of the invention also allow scaling of source/drain sidewalls in the region receiving the pre-gate etch poly implant, since the NMOS transistors do not have to solely rely on n-type doping coming from n-type S/D implants. For circuitry having NMOS and PMOS gates coupled by polysilicon, such as the memory cell area of SRAMs, design rules (such as spacing of n-poly mask edge to n-well boundary) can be made tighter to enable shrinks for improved density.

Although the invention has generally been described relative to SRAMs, as noted above, the invention is not limited to SRAMs since the invention is generally applicable to any CMOS circuit that has NMOS and PMOS gates, such as those having NMOS and PMOS gates coupled by polysilicon. For example, as noted above, the invention is generally applicable to a wide variety of CMOS circuits including microprocessors, signal processing, communication circuits and memory comprising circuits other than SRAM, such as DRAM.

The invention is also not limited to the use of silicon wafers, and may be implemented in association with the manufacture of various semiconductor devices, SRAM memory devices, or other such devices, wherein the design and optimization of an SRAM cell is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating a CMOS integrated circuit having NMOS and PMOS transistors with polysilicon gates coupled by polysilicon lines in both memory cell and non-memory cell areas, the method comprising:
    forming a layer of polysilicon gate material over a semiconductor surface of a substrate;
    implanting n-type dopant in a pre-gate patterning implant into the layer of polysilicon material in NMOS transistor gate regions of non-memory cell areas, while masking the layer of polysilicon material in PMOS transistor gate regions of non-memory cell areas and in NMOS and PMOS transistor gate regions of memory cell areas against implantation;
    following the pre-gate patterning implant, patterning the layer of polysilicon material to form polysilicon gate electrodes and polysilicon lines connecting polysilicon gate electrodes in the NMOS and PMOS transistor gate regions in both the memory cell and non-memory cell areas; and
    following the patterning the layer of polysilicon material, implanting n-type dopant into source/drain areas of the semiconductor surface adjacent sides of the polysilicon gate electrodes in the NMOS transistor regions, and implanting p-type dopant into source/drain areas of the semiconductor surface adjacent sides of the polysilicon gate electrode in the PMOS transitor regions.

2. The method of claim 1, further comprising forming a silicide layer over the polysilicon lines.

3. The method of claim 1, wherein the circuit comprises an SRAM circuit with NMOS and PMOS transistor pairs defining pull-up and pull-down transistors of cross-coupled inverters of bit cells in the memory area.

4. The method of claim 1, further comprising performing an anneal to activate the dopant from the pre-gate patterning implant prior to patterning the layer of polysilicon material.

5. The method of claim 1, wherein implanting dopant into the source/drain areas also implants dopant into the polysilicon gate electrodes.

6. The method of claim 5, wherein the pre-gate patterning implant comprises implanting the n-type dopant at a dose of between $5 \times 10^{14}$ atoms/cm$^2$ and $5 \times 10^{15}$ atoms/cm$^2$.

7. The method of claim 6, wherein implanting into the source/drain areas adjacent sides of polysilicon gate electrodes in the NMOS transistor gate regions comprises implanting the same or different n-type dopant at a dose of between $2 \times 10^{15}$ atoms/cm$^2$ and $5 \times 10^{15}$ atoms/cm$^2$.

8. The method of claim 7, further comprising forming a silicide layer over the polysilicon lines.

9. The method of claim 8, wherein the circuit comprises an SRAM circuit with NMOS and PMOS transistor pairs defining pull-up and pull-down transistors of cross-coupled inverters of bit cells in the memory area.

10. The method of claim 9, further comprising performing an anneal to activate the dopant from the pre-gate patterning implant prior to patterning the layer of polysilicon material.

* * * * *